United States Patent
Takeda et al.

(10) Patent No.: US 9,215,762 B2
(45) Date of Patent: Dec. 15, 2015

(54) LIGHT-EMITTING DEVICE AND METHOD OF MANUFACTURING THE SAME

(71) Applicant: TOYODA GOSEI CO., LTD., Kiyosu-shi (JP)

(72) Inventors: Shigeo Takeda, Kiyosu (JP); Shota Yamamori, Kiyosu (JP); Mitsushi Terakami, Kiyosu (JP); Makoto Ishida, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 178 days.

(21) Appl. No.: 13/705,093

(22) Filed: Dec. 4, 2012

(65) Prior Publication Data

US 2013/0154474 A1    Jun. 20, 2013

(30) Foreign Application Priority Data

Dec. 14, 2011    (JP) ................................ 2011-273582

(51) Int. Cl.
| H01L 33/50 | (2010.01) |
| H01L 33/58 | (2010.01) |
| H05B 33/04 | (2006.01) |
| H05B 33/10 | (2006.01) |

(52) U.S. Cl.
CPC .............. *H05B 33/04* (2013.01); *H01L 33/508* (2013.01); *H05B 33/10* (2013.01)

(58) Field of Classification Search
CPC ........................... H01L 33/507; H01L 33/508
USPC .................. 313/512; 257/98–100; 445/25, 24
See application file for complete search history.

(56) References Cited

U.S. PATENT DOCUMENTS

| 6,472,765 B1 * | 10/2002 | Sano et al. ................... 257/787 |
| 7,332,746 B1 | 2/2008 | Takahashi et al. |
| 7,906,904 B2 * | 3/2011 | Kawae et al. ................. 313/512 |
| 2005/0077535 A1 * | 4/2005 | Li .................................. 257/100 |
| 2010/0065983 A1 | 3/2010 | Kawakubo |
| 2011/0193118 A1 * | 8/2011 | Oshima et al. ................. 257/98 |

(Continued)

FOREIGN PATENT DOCUMENTS

| JP | 2001-144331 A | 5/2001 |
| JP | 2008-207450 A | 9/2008 |

(Continued)

OTHER PUBLICATIONS

Japanese Office Action dated Nov. 25, 2014 with partial English translation.

(Continued)

*Primary Examiner* — Karabi Guharay
(74) *Attorney, Agent, or Firm* — McGinn IP Law Group, PLLC.

(57) ABSTRACT

A method of manufacturing a light-emitting device includes placing a phosphor-containing film on a mold for compression molding, the mold having a concave portion of a predetermined shape and the film being placed along an inner wall of the concave portion, supplying a resin material on the phosphor-containing film in the concave portion, immersing a light-emitting element mounted on a substrate in the resin material in the concave portion, and applying pressure and heat to the resin material and the phosphor-containing film, thereby forming a transparent sealing resin for sealing the light-emitting element and a phosphor-containing layer covering a surface thereof.

13 Claims, 6 Drawing Sheets

(56) References Cited

U.S. PATENT DOCUMENTS

| | | |
|---|---|---|
| 2011/0198780 A1 | 8/2011 | Basin et al. |
| 2012/0153345 A1 | 6/2012 | Ozaki et al. |
| 2014/0284648 A1 | 9/2014 | Basin et al. |

FOREIGN PATENT DOCUMENTS

| | | |
|---|---|---|
| JP | 2009-81288 A | 4/2009 |
| JP | 2010-021497 A | 1/2010 |
| JP | 2012-129361 A | 7/2012 |
| JP | 2013-520004 A | 5/2013 |

OTHER PUBLICATIONS

Japanese Office Action dated Feb. 10, 2015 with a partial English Translation.

* cited by examiner

5 PHOSPHOR-CONTAINING LAYER
6 PHOSPHOR

US 9,215,762 B2

LIGHT-EMITTING DEVICE AND METHOD OF MANUFACTURING THE SAME

The present application is based on Japanese patent application No. 2011-273582 filed on Dec. 14, 2011, the entire contents of which are incorporated herein by reference.

BACKGROUND OF THE INVENTION

1. Field of the Invention

The invention relates to a light-emitting device and a method of manufacturing the light-emitting device.

2. Related Art

A method of manufacturing a light-emitting device is known that a transparent sealing resin is compression-molded to seal an LED chip on a substrate (see, e.g., JP-A-2008-207450). In the method disclosed in JP-A-2008-207450, since the transparent sealing resin is compression-molded in a state that a surface of a mold for compression molding is covered with a release film, the molded transparent sealing resin can be easily released from the mold due to the release film.

On the other hand, a light-emitting device is known that a phosphor layer is formed on a transparent sealing resin sealing an LED chip on a substrate (see, e.g., JP-A-2009-81288). Such a technique for forming a phosphor-containing film at a position apart from the LED chip is generally called remote phosphor. In such a device, an electron in phosphor in the phosphor layer is excited by light emitted from the LED chip and produces fluorescence.

When the phosphor layer is provided, it is possible to use less phosphor and to thus reduce manufacturing cost of light-emitting devices as compared to the case of mixing phosphors with the transparent sealing resin. In addition, although unevenness in light path length from the LED chip to the surface of the transparent sealing resin and color unevenness due to a viewing angle occur depending on a shape of the transparent sealing resin when the phosphor is uniformly distributed in the transparent sealing resin, such problems can be solved when the phosphor layer is provided.

SUMMARY OF THE INVENTION

Since the phosphor layer of the light-emitting device described in JP-A-2009-81288 is formed by applying a phosphor slurry to the surface of the transparent sealing resin, it is difficult to form a phosphor layer with a desired thickness. Therefore, it is difficult to control phosphor distribution and it is thus difficult to extract light having a desired wavelength from the light-emitting device.

Accordingly, it is an object of the invention to provide a light-emitting device that allows the extraction of light with a desired wavelength therefrom, and a method of manufacturing the light-emitting device.

(1) According to one embodiment of the invention, a method of manufacturing a light-emitting device comprises:

placing a phosphor-containing film on a mold for compression molding, the mold having a concave portion of a predetermined shape and the film being placed along an inner wall of the concave portion;

supplying a resin material on the phosphor-containing film in the concave portion;

immersing a light-emitting element mounted on a substrate in the resin material in the concave portion; and applying pressure and heat to the resin material and the phosphor-containing film, thereby forming a transparent sealing resin for sealing the light-emitting element and a phosphor-containing layer covering a surface thereof.

In the above embodiment (1) of the invention, the following modifications and changes can be made.

(i) The phosphor-containing film is placed so as to be in contact with the inner wall of the concave portion, and wherein the phosphor-containing layer functions as a release film when the substrate, the light-emitting element, the transparent sealing resin and the phosphor-containing layer are released from the mold.

(ii) The phosphor-containing film comprises a concavo-convex surface on one side thereof.

(iii) The phosphor-containing film comprises a concavo-convex surface on both sides thereof.

(iv) The phosphor-containing layer is thicker at a portion on an apex of the transparent sealing resin than at a portion on a side portion of the transparent sealing resin.

(v) The transparent sealing resin has a hemispherical shape.

(2) According to another embodiment of the invention, a light-emitting device comprises:

a substrate;

a light-emitting element mounted on the substrate;

a transparent sealing resin for sealing the light-emitting element; and a phosphor-containing layer that is formed on a surface of the transparent sealing resin, and comprises a transparent resin containing a phosphor and a concavo-convex surface on one side thereof, wherein the phosphor-containing layer is thicker at a portion on an apex of the transparent sealing resin than at a portion on a side portion of the transparent sealing resin.

In the above embodiment (2) of the invention, the following modifications and changes can be made.

(vi) The phosphor-containing layer further comprises a concavo-convex surface on both sides thereof.

(vii) The transparent sealing resin has a hemispherical shape.

Effects of the Invention

According to one embodiment of the invention, a light-emitting device can be provided that allows the extraction of light with a desired wavelength therefrom, as well as a method of manufacturing the light-emitting device.

BRIEF DESCRIPTION OF THE DRAWINGS

Next, the present invention will be explained in more detail in conjunction with appended drawings, wherein.

DESCRIPTION OF THE PREFERRED EMBODIMENTS

First Embodiment
Structure of Light-Emitting Device

Figure 1:
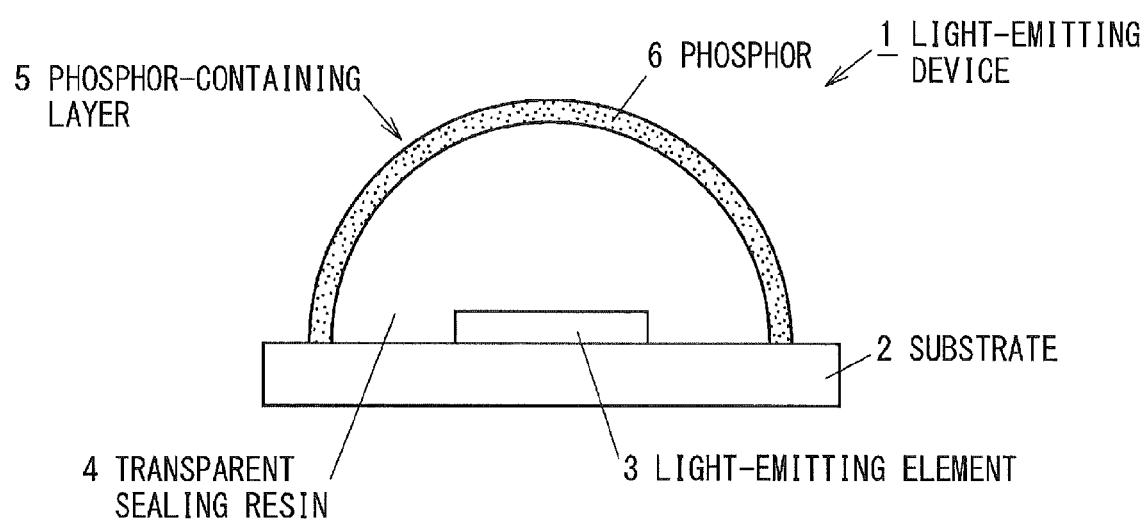
FIG. 1 is a vertical cross-sectional view showing a light-emitting device in a first embodiment.

FIG. 1 is a vertical cross-sectional view showing a light-emitting device in the first embodiment. A light-emitting device 1 has a substrate 2, a light-emitting element 3 mounted on the substrate 2, a transparent sealing resin 4 for sealing the light-emitting element 3, and a phosphor-containing layer 5 covering a surface of the transparent sealing resin 4.

The substrate 2 is, e.g., a ceramic substrate. The substrate 2 has a non-illustrated wiring on a surface or inside thereof. The wiring is electrically connected to the light-emitting element 3 and voltage is applied to the light-emitting element 3 via the wiring.

The light-emitting element 3 is an LED chip which emits, e.g., blue light or ultraviolet light.

The transparent sealing resin 4 has, e.g., a hemispherical shape as shown in FIG. 1 and is placed so as to cover at least a light-emitting surface of the light-emitting element 3. The transparent sealing resin 4 is formed of a transparent resin such as silicone resin or epoxy resin.

The phosphor-containing layer 5 is formed of a transparent resin film containing a particulate phosphor 6. A thickness of the phosphor-containing layer 5 is, e.g., 0.5 mm.

The phosphor 6 may be composed of several types of phosphors which produce fluorescence with different wavelengths.

The transparent resin film constituting the phosphor-containing layer 5 is formed of a thermoplastic resin such as PET (polyethylene terephthalate), PC (polycarbonate), acrylic or ETFE (ethylene tetrafluoroethylene copolymer), or a thermosetting resin such as silicone resin or epoxy resin. In addition, as described later, the phosphor-containing layer 5 is used as a release film when releasing the compression-molded transparent sealing resin 4 and phosphor-containing layer 5 from the mold, and accordingly, it is preferable that the transparent resin film have a property allowing easy release from the mold.

A portion of light emitted from the light-emitting element 3 exits to the outside through the phosphor-containing layer 5, and another portion excites an electron in the phosphor 6 in the phosphor-containing layer 5. The phosphor 6 with the excited electron produces fluorescence with wavelength corresponding to magnitude of band gap.

When the light emitted from the light-emitting element 3 is visible light, an emission color of the light-emitting device 1 is a mixture of a color of the light exiting to the outside through the phosphor-containing layer 5 and a color of the fluorescence produced by the phosphor 6.

Followings are combinations of emission color of the light-emitting element 3 and that of the phosphor 6 when the emission color of the light-emitting device 1 is white. When the emission color of the light-emitting element 3 is blue and that of the phosphor 6 is yellow, bluish white light is obtained. When the emission color of the light-emitting element 3 is blue and the emission colors of the phosphor 6 are green and red, white light close to the color of sunlight is obtained. When the emission color of the light-emitting element 3 is blue and the emission colors of the phosphor 6 are yellow and red, reddish-white light close to a color of an incandescent lamp is obtained.

In addition, when the light-emitting element 3 emits ultraviolet light and the emission colors of the phosphor 6 are blue and yellow, bluish white light is obtained. When the light-emitting element 3 emits ultraviolet light and the emission colors of the phosphor 6 are blue, green and red, white light close to the color of sunlight is obtained. When the light-emitting element 3 emits ultraviolet light and the emission colors of the phosphor 6 are blue, yellow and red, reddish-white light close to a color of an incandescent lamp is obtained.

When the phosphor 6 emits lights with several different colors, the phosphor-containing layer 5 may include multiple transparent resin films each of which contains a different phosphor 6. When the emission colors of the phosphor 6 are, e.g., red and yellow, one transparent resin film may contain a phosphor 6 emitting red light and a phosphor 6 emitting yellow light, or alternatively, a transparent resin film containing a phosphor 6 emitting red light and that containing a phosphor 6 emitting yellow light may be laminated.

Note that, when the phosphor-containing layer 5 includes multiple transparent resin films, it is preferable that a transparent resin film containing a phosphor 6 emitting light having a long wavelength be a lower layer to prevent light emitted from a phosphor 6 in a lower transparent resin film from being absorbed by a phosphor 6 in an upper transparent resin film.

In addition, the transparent sealing resin 4 may contain a phosphor 6. In this case, the emission color of the phosphor 6 in the phosphor-containing layer 5 and the emission color of the phosphor 6 in the transparent sealing resin 4 may be either the same or different.

Method of Manufacturing the Light-Emitting Device

FIGS. 2A to 2E are vertical cross-sectional views showing a method of manufacturing the light-emitting device in the first embodiment.

Figure 2A:
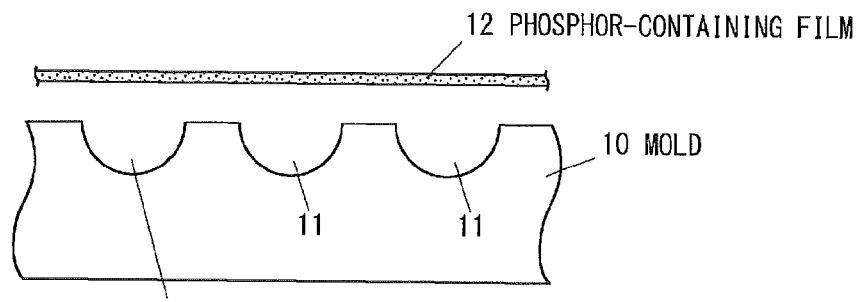
FIGS. 2A to 2E are vertical cross-sectional views showing a method of manufacturing the light-emitting device in the first embodiment.

Firstly, a mold 10 and a phosphor-containing film 12 are prepared as shown in FIG. 2A. The mold 10 is used for compression molding of the transparent sealing resin 4 and the phosphor-containing layer 5, and is provided with a concave portion 11 having a shape corresponding to the shapes of the transparent sealing resin 4 and the phosphor-containing layer 5.

The phosphor-containing film 12 is a film to be formed into the phosphor-containing layer 5 by compression molding, and is a transparent resin film containing the phosphor 6.

Figure 2B:
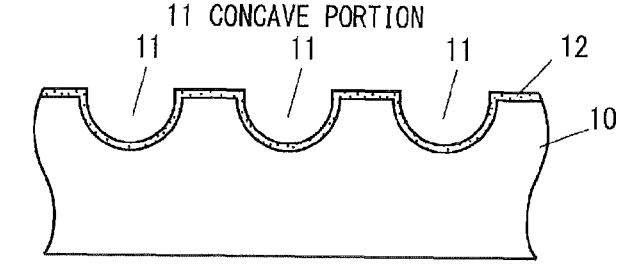

Next, as shown in FIG. 2B, the phosphor-containing film 12 is placed along an inner wall of the concave portion 11 of the mold 10. At this time, the phosphor-containing film 12 is in contact with the inner wall of the concave portion 11. The phosphor-containing film 12 is brought into tightly contact with the inner wall of the concave portion 11 by, e.g., vacuuming using a vacuuming hole present on a bottom of the concave portion 11.

Figure 2C:
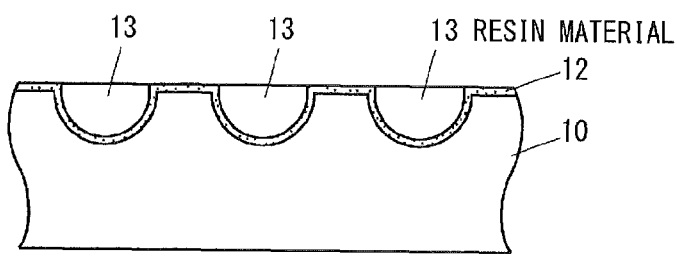

Next, as shown in FIG. 2C, a resin material 13 is supplied on the phosphor-containing film 12 in the concave portion 11.

Figure 2D:
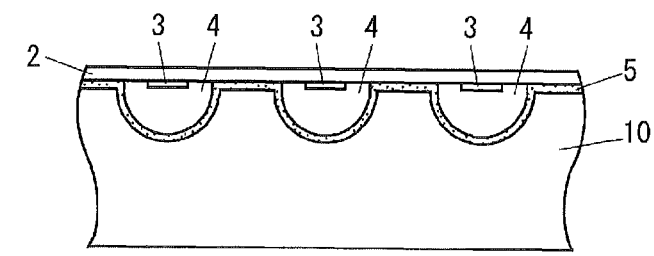

Next, as shown in FIG. 2D, the light-emitting element 3 mounted on the substrate 2 is immersed in the resin material 13 in the concave portion 11, and pressure and heat are applied to the resin material 13 and the phosphor-containing film 12, thereby respectively forming the transparent sealing resin 4 and the phosphor-containing layer 5 covering the surface thereof.

Figure 2E:
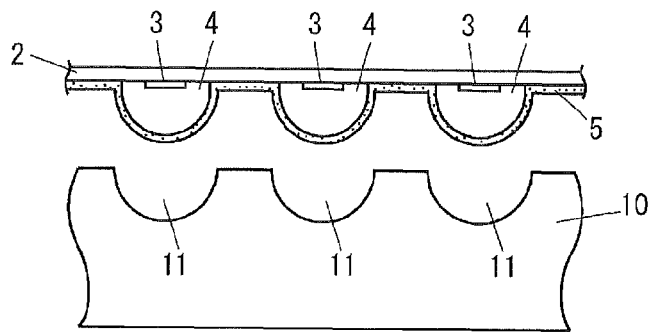

Next, as shown in FIG. 2E, the substrate 2, the light-emitting element 3, the transparent sealing resin 4 and the phosphor-containing layer 5 are released from the mold 10. At this time, the phosphor-containing layer 5 functions as a release film for helping release from the mold.

The substrate 2 is subsequently divided, thereby obtaining individual light-emitting devices 1.

In the first embodiment, the phosphor-containing layer 5 is formed by compression molding and thus can be formed to have a desired thickness, e.g., a uniform thickness. As a result, it is possible to obtain the light-emitting device 1 with less unevenness in emission color and excellent in color reproducibility.

In addition, waste, such as a release film which is generally discarded, is eliminated by using the phosphor-containing layer 5 as a release film as compared to the case in which a release film is separately prepared, which allows the manufacturing cost of the light-emitting device 1 to be reduced.

In addition, since the phosphor-containing layer 5 and the transparent sealing resin 4 can be simultaneously formed by compression molding, it is possible to decrease the number of processes and thus to reduce manufacturing cost as compared to the case where the phosphor-containing layer 5 is formed by a coating method, etc., in a separate process from the transparent sealing resin 4.

Second Embodiment

In the second embodiment, the phosphor-containing layer 5 has concavo-convex portions (or recesses and protrusions) on the surface thereof. Note that, the explanation for the same configuration as the first embodiment will be omitted or simplified.

Figure 3A:
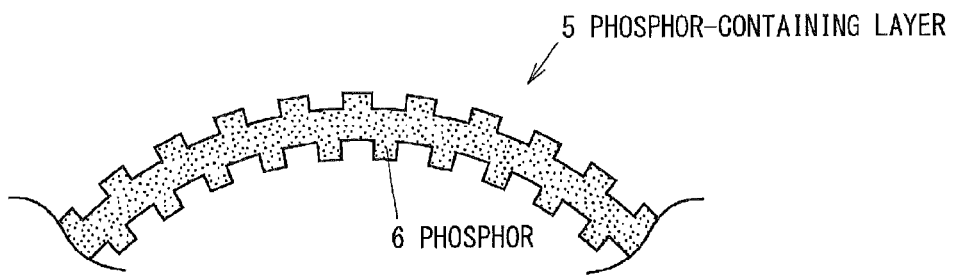
FIGS. 3A to 3D are partial enlarged vertical cross-sectional views showing a phosphor-containing layer in a second embodiment.
Figure 3B:
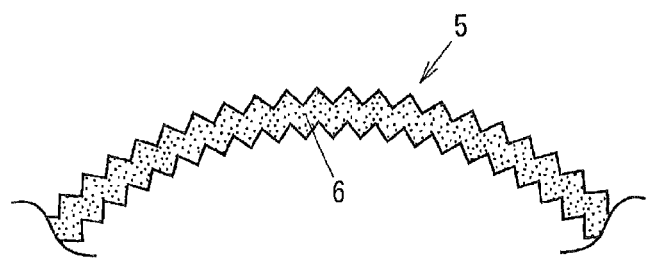
Figure 3C:
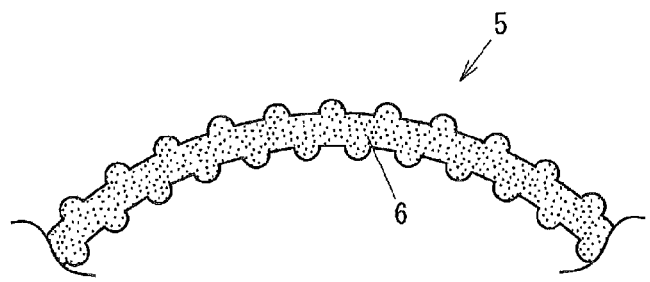
Figure 3D:
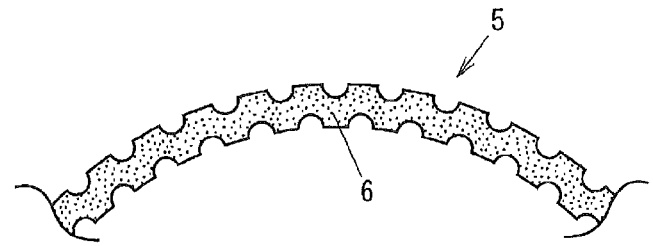

FIGS. 3A to 3D are partial enlarged vertical cross-sectional views showing a phosphor-containing layer in the second embodiment. FIG. 3A shows the phosphor-containing layer 5 which has concavo-convex portions (or recesses and protrusions) having a rectangular cross section on front and back sides. FIG. 3D shows the phosphor-containing layer 5 which has concavo-convex portions having a triangular cross section on front and back sides. FIG. 3C shows the phosphor-containing layer 5 having concavo-convex portions on front and back sides, in which the convex portions (or protrusions) have a semicircular cross section. FIG. 3D shows the phosphor-containing layer 5 having concavo-convex portions on front and back sides, in which the concave portion (or recesses) have a semicircular cross section.

The shape of the concavo-convex portions of the phosphor-containing layer 5 is not limited to those shown in FIGS. 3A to 3D. The pattern of the concavo-convex portions of the phosphor-containing layer 5 may be a dot shape or a line shape. The shapes of the concavo-convex portions of the phosphor-containing layer 5 on the front and back sides may be different. In addition, the concavo-convex portions of the phosphor-containing layer 5 may be formed on only one of the front and back sides.

The concavo-convex portions on the front side (i.e., the upper side in FIGS. 3A to 3D) of the phosphor-containing layer 5 reduce adhesion between the phosphor-containing layer 5 and the mold 10, and facilitates release of the substrate 2, the light-emitting element 3, the transparent sealing resin 4 and the phosphor-containing layer 5 from the mold 10.

Therefore, even when the transparent resin film of the phosphor-containing layer 5 is formed of a material having high adhesion with the mold 10, it is possible to easily release from the mold. In addition, the concavo-convex portions can reduce complete reflection of the light emitted from the light-emitting element 3 and allows light extraction efficiency of the light-emitting device 1 to be improved.

The concavo-convex portions on the back side (i.e., the lower side in FIGS. 3A to 3D) of the phosphor-containing layer 5 enhances adhesion between the phosphor-containing layer 5 and the transparent sealing resin 4. As a result, it is possible to prevent the phosphor-containing layer 5 from separating from the transparent sealing resin 4 during, e.g., a process of releasing the substrate 2, the light-emitting element 3, the transparent sealing resin 4 and the phosphor-containing layer 5 from the mold 10.

Third Embodiment

The third embodiment is different from the first embodiment in that the transparent sealing resin 4 has a shape other than hemisphere. Note that, the explanation for the same configuration as the first embodiment will be omitted or simplified.

Figure 4A:
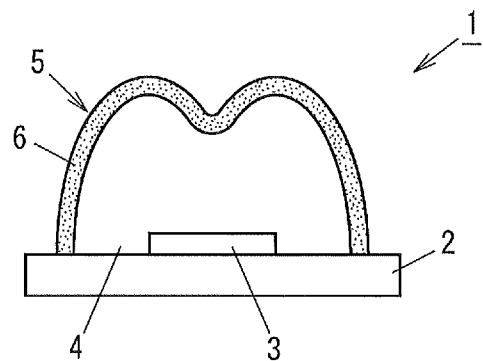
FIGS. 4A to 4D are vertical cross-sectional views showing a light-emitting device in a third embodiment.
Figure 4B:
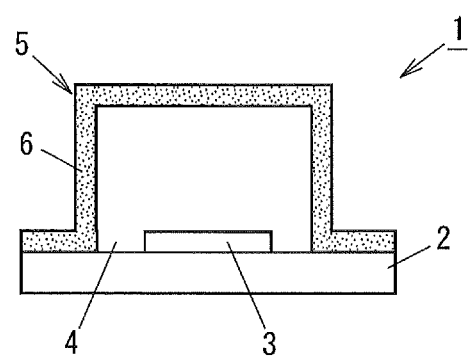
Figure 4C:
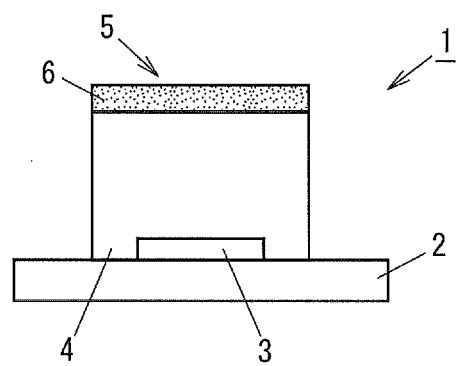
Figure 4D:
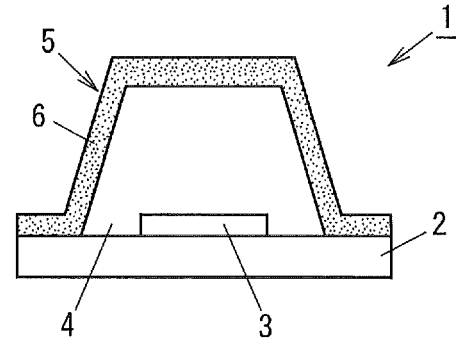

FIGS. 4A to 4D are vertical cross-sectional views showing a light-emitting device in the third embodiment. FIG. 4A shows the light-emitting device 1 in which the transparent sealing resin 4 has a cross section in a mountain shape having several peaks. FIG. 4B shows the light-emitting device 1 in which the transparent sealing resin 4 has a rectangular cross section. FIG. 4C shows the light-emitting device 1 in which the transparent sealing resin 4 has a rectangular cross section and the phosphor-containing layer 5 is formed only on the upper surface of the transparent sealing resin 4. FIG. 4D shows the light-emitting device 1 in which the transparent sealing resin 4 has a trapezoidal cross section.

The shape of the transparent sealing resin 4 is not limited to those shown in FIGS. 4A to 4D.

The transparent sealing resin 4 and the phosphor-containing layer 5 are formed by compression molding in the same manner as the first embodiment. Accordingly, it is possible to form the phosphor-containing layer 5 so as to have a desired thickness, e.g., a uniform thickness even when the shape of the transparent sealing resin 4 is complicated. It is difficult to form the phosphor-containing layer 5 with a desired thickness on the transparent sealing resin 4 having a complicated shape when the phosphor-containing layer 5 is formed by, e.g., applying a phosphor slurry to the surface of the transparent sealing resin 4.

Note that, for forming the transparent sealing resin 4 and the phosphor-containing layer 5 shown in FIG. 4C, one continuous transparent sealing resin 4 and one continuous phosphor-containing layer 5 are formed using the mold 10 provided with the concave portion 11 having a large area and are subsequently cut into pieces.

Fourth Embodiment

In the fourth embodiment, the thickness of the phosphor-containing layer 5 is not uniform. Note that, the explanation for the same configuration as the first embodiment will be omitted or simplified.

Figure 5A:
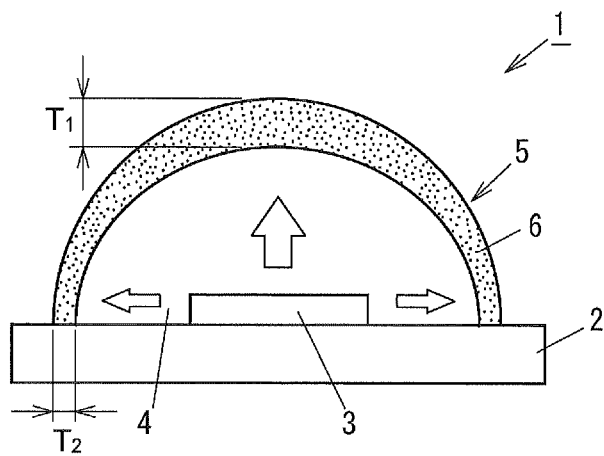
FIGS. 5A and 5B are vertical cross-sectional views showing a light-emitting device in a fourth embodiment.
Figure 5B:
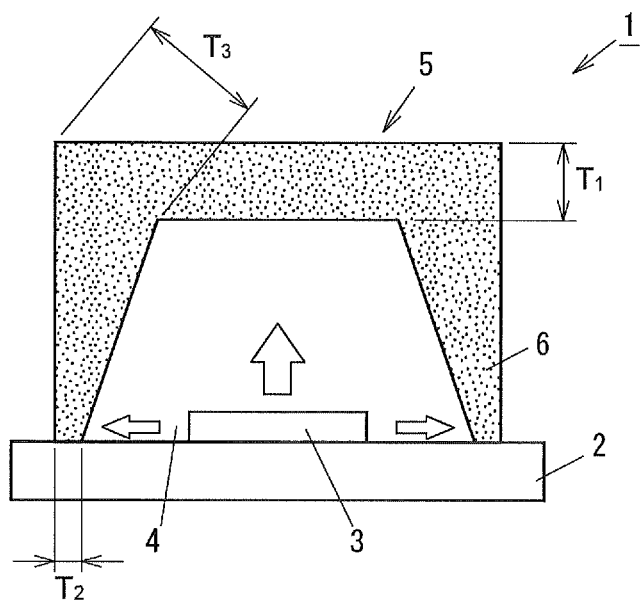

FIGS. 5A and 5B are vertical cross-sectional views showing a light-emitting device in the fourth embodiment. The light-emitting element 3 in the fourth embodiment is a plate-like light-emitting element of which light emission intensity is stronger in a vertical direction (i.e., an upward direction in FIG. 5) than in a horizontal direction (i.e., a lateral direction in FIG. 5).

The transparent sealing resin 4 shown in FIG. 5A has a hemispherical shape. Then, in the phosphor-containing layer 5, a thickness T1 of a portion on an apex of the transparent sealing resin 4 is greater than a thickness T2 of a portion on a side portion of the transparent sealing resin 4.

The transparent sealing resin 4 shown in FIG. 5B has a trapezoidal cross section. Meanwhile, the phosphor-containing layer 5 has a rectangular cross section. Then, in the phosphor-containing layer 5, the thickness T1 of a portion on the top (upper surface) of the transparent sealing resin 4 is greater than the thickness T2 of a portion on a side portion of the transparent sealing resin 4. Note that, a thickness 3 of the phosphor-containing layer 5 from an edge of an upper side of the transparent sealing resin 4 to an edge of an upper side of the phosphor-containing layer 5 when viewed in a cross section is greater than the thickness T1.

Since the thickness T1 is greater than thickness T2, a portion of the phosphor-containing layer 5 on which more light is incident contains more phosphor 6 and it is thereby possible to efficiently produce fluorescence. In this case, the phosphor-containing film 12 to be molded into the phosphor-containing layer 5 has a greater thickness in a portion placed on a bottom of the concave portion 11 of the mold 10 than in other portion.

Fifth Embodiment

The fifth embodiment is different from the first embodiment in that a release film is used in addition to a phosphor-containing film at the time of compression molding.

FIGS. 6A to 6D are vertical cross-sectional views showing a method of manufacturing a light-emitting device in the fifth embodiment.

Figure 6A:
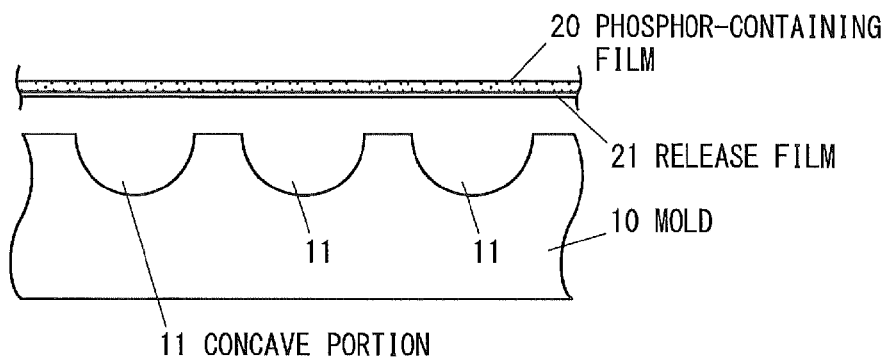
FIGS. 6A to 6D are vertical cross-sectional views showing a method of manufacturing a light-emitting device in a fifth embodiment.

Firstly, as shown in FIG. 6A, the mold 10, a phosphor-containing film 20 and a release film 21 are prepared. The phosphor-containing film 20 and the release film 21 may be preliminarily stuck together, as shown in FIG. 6A.

Figure 6B:
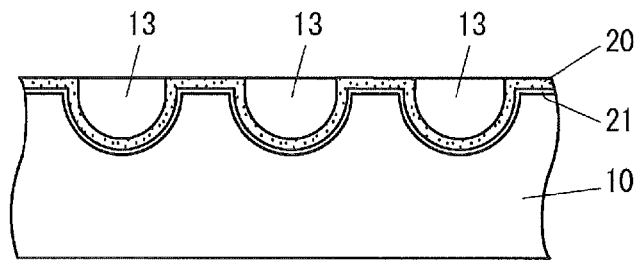

Next, as shown in FIG. 6B, the phosphor-containing film 20 and the release film 21 are placed along an inner wall of the concave portion 11 of the mold 10. At this time, the release film 21 is in contact with the inner wall of the concave portion 11. The release film 21 is brought into tightly contact with the inner wall of the concave portion 11 by, e.g., vacuuming using a vacuuming hole present on a bottom of the concave portion 11.

Figure 6C:
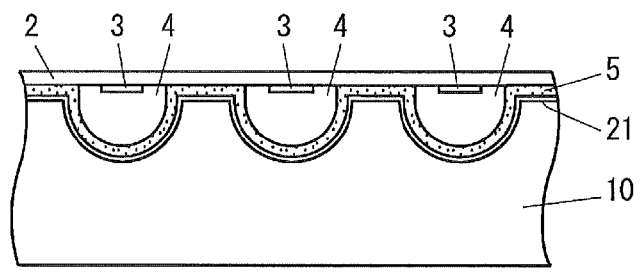

Next, as shown in FIG. 6C, the resin material 13 is supplied on the phosphor-containing film 20 in the concave portion 11, the light-emitting element 3 mounted on the substrate 2 is immersed in the resin material 13 in the concave portion 11, and pressure and heat are applied to the resin material 13 and the phosphor-containing film 20, thereby respectively forming the transparent sealing resin 4 and the phosphor-containing layer 5 covering the surface thereof.

Figure 6D:
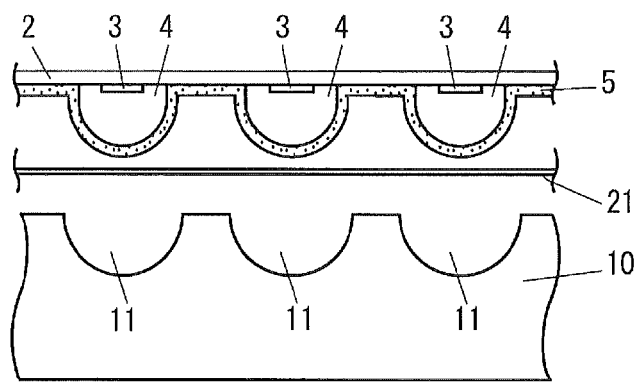

Next, as shown in FIG. 6D, the substrate 2, the light-emitting element 3, the transparent sealing resin 4 and the phosphor-containing layer 5 are released from the mold 10. The release from the mold is facilitated by the release film 21.

The substrate 2 is subsequently divided, thereby obtaining individual light-emitting devices 1.

The phosphor-containing film 20 in the fifth embodiment is formed of a transparent resin film containing the phosphor 6 in the same manner as the phosphor-containing film 12 of the first embodiment but is not required to have a function as a release film, which provides a wider choice of materials than for the phosphor-containing film 12.

It should be noted that the present invention is not intended to be limited to the above-mentioned embodiments, and the various kinds of modifications can be implemented without departing from the gist of the present invention. For example, a resin composite lead frame having a desired pattern filled with a resin may be used instead of the substrate 2.

In addition, the constituent elements of the embodiments can be arbitrary combined without departing from the gist of the invention.

The invention according to claims is not to be limited to the above-mentioned embodiments. Further, please note that all combinations of the features described in the embodiments are not necessary to solve the problem of the invention.

What is claimed is:

1. A method of manufacturing a light-emitting device, the method comprising:
   placing a phosphor-containing film on a mold for compression molding, the mold comprising a concave portion of a predetermined shape and the film being placed along an inner wall of the concave portion;
   supplying a resin material on the phosphor-containing film in the concave portion;
   immersing a light-emitting element mounted on a substrate in the resin material in the concave portion; and
   applying pressure and heat to the resin material and the phosphor-containing film, thereby forming a transparent sealing resin for sealing the light-emitting element and a phosphor-containing layer covering a surface thereof,
   wherein the phosphor-containing film is placed so as to be in direct contact with the inner wall of the concave portion, and
   wherein the phosphor-containing layer functions as a release film when the substrate, the light-emitting element, the transparent sealing resin, and the phosphor-containing layer are released from the mold.

2. The method according to claim 1, wherein the phosphor-containing film comprises a concavo-convex surface on one side thereof.

3. The method according to claim 1, wherein the phosphor-containing film comprises a concavo-convex surface on both sides thereof.

4. The method according to claim 1, wherein the phosphor-containing layer is thicker at a portion on an apex of the transparent sealing resin than at a portion on a side portion of the transparent sealing resin.

5. The method according to claim 1, wherein the transparent sealing resin has a hemispherical shape.

6. The method according to claim 1, wherein said supplying the resin material on the phosphor-containing film comprises filling a cavity in the concave portion with the resin material.

7. The method according to claim 6, wherein, in said filling the cavity in the concave portion with the resin material, an upper surface of the resin material is flush with an upper surface of the phosphor-containing film.

8. The method according to claim 1, wherein said supplying the resin material on the phosphor-containing film in the concave portion is conducted before said immersing the light-emitting element in the concave portion.

9. The method according to claim 1, wherein the resin material is placed in the concave portion separately from placing the light-emitting element in the concave portion.

10. The method according to claim 1, wherein the phosphor-containing film comprises a plurality of concavo-convex surfaces on one side of the phosphor-containing film.

11. The method according to claim 10, wherein the phosphor-containing film further comprises the concavo-convex surfaces on another side that opposes the one side of the phosphor-containing film.

12. The method according to claim 1, further comprising:
   disposing a release film on a bottom surface of the phosphor-containing film before placing the phosphor-containing film on the mold.

13. The method according to claim 1, wherein, in a cross sectional view, a thickness of the phosphor-containing layer from an edge of an upper side of the transparent sealing resin to an edge of an upper side of the phosphor-containing layer is greater than a thickness of the phosphor-containing layer at a portion on a side portion of the transparent sealing resin.

* * * * *